United States Patent [19]

Fache et al.

[11] 4,146,850

[45] Mar. 27, 1979

[54] TUNABLE UHF OSCILLATOR WITH HARMONIC LIMITATION

[75] Inventors: Michel Fache; Claude Juliot, both of Paris, France

[73] Assignee: Lignes Telegraphoques et Telephoniques (Societe), Paris Cedex, France

[21] Appl. No.: 884,390

[22] Filed: Mar. 8, 1978

[30] Foreign Application Priority Data

Mar. 14, 1977 [FR] France .......................... 77 07492
Jan. 25, 1978 [FR] France .......................... 78 01979

[51] Int. Cl.² .......................................... H03B 5/12
[52] U.S. Cl. .......................... 331/117 R; 331/177 V
[58] Field of Search ............. 331/177 V, 36 C, 117 R; 332/30 V; 334/15

[56] References Cited

U.S. PATENT DOCUMENTS 3,103,637  9/1963  Pan .................................. 331/177 V

FOREIGN PATENT DOCUMENTS 1964680  12/1969  Fed. Rep. of Germany .......... 331/177

Primary Examiner—John Kominski
Attorney, Agent, or Firm—Kemon & Estabrook

[57] ABSTRACT

In a tunable UHF transistor oscillator with a frequency determining resonating LC circuit reduction of the harmonic to fundamental ratio is obtained through the use of an output circuit consisting of an output resistor connected in parallel with a resistor voltage divider a part of which is used as a damping resistor for a second controllable tuned circuit comprising an inductor with a larger inductance than that of the frequency determining circuit and the same capacitance and a non linear circuit between the control voltage source and the adjustable capacitor of said second circuit. The output is taken across the second tuned circuit. Coupling between the transistor and the frequency determining circuit is low.

6 Claims, 7 Drawing Figures

TUNABLE UHF OSCILLATOR WITH HARMONIC LIMITATION

BACKGROUND OF THE INVENTION AND PRIOR ART

The invention concerns a voltage controlled generator for sinusoidal waves operating in the ultra high frequency range tuned through control of the capacity (V.C.O.) of L.C. frequency determining circuit incorporating a reverse biased diode which will hereinafter be referred to as a "varicap".

Tunable resonating circuits comprising a varicap which can be used in oscillators have already been described, for example in connection with receivers operating in the frequency bands allotted to radio broadcasting and to television. By way of example, there is described in French Pat. No. 2 032 335, applied for on the 11th Feb., 1970, by the Company MOTOROLA, a television receiver oscillator having a varicap which is tuned by the same control voltage as the varicap resonating circuits provided in the high frequency stages, so as to permit mixing of the received signal into the intermediate frequency of the receiver. Since a varicap diode is an element exhibiting a non linear current voltage characteristic, its presence in a circuit tuned at the frequency $f_o$ results in the production of harmonics at the frequencies $2f_o$, $3f_o$, and so on.

There have also been described tunable oscillator arrangements comprising two simultaneously controlled resonating circuits comprising varicap, such as in French Pat. No. 2 003 205, wherein a coupling between the two circuits is utilized to increase the bandwidth of the circuit.

The present invention has for its object to provide means for limiting the harmonic ratio of an UHF oscillator which is electronically tunable by means of a varicap.

BRIEF SUMMARY OF THE INVENTION

The means for limiting the harmonic content of an UHF source consisting of a transistor oscillator and a first resonant circuit comprising a first voltage controlled capacitance according to the invention consists in an output circuit comprising a fixed resistor to the terminals of which there is connected a resistor voltage divider, a second damped tuned circuit comprising a second adjustable capacitance connected at an intermediate point on this divider the load being connected to the terminals of the second tuned circuit.

In accordance with an important feature of the invention, the second capacitance is connected to the same control voltage source as the first capacitance through a non linear circuit and the resonant frequency of the second resonating circuit is lower than the oscillation frequency in a considerable part of the operating frequency band.

In accordance with another feature of the invention, the second tuned circuit consists of an inductance whose value is between two and six times that of the inductance of the tuned circuit defining the oscillation frequency.

The harmonic ratio limiting apparatus according to the invention makes it possible to obtain a difference of levels between the wave at fundamental frequency and the second harmonic which is at least equal to 15 dB and the difference of levels between the wave at fundamental frequency and the higher harmonics are even greater.

BRIEF DESCRIPTION OF THE DRAWINGS

The features of the invention are indicated in greater detail in the following description accompanied by FIGS. 1 to 7 which are given by way of non limiting illustration and in which.

DETAILED DESCRIPTION

Figure 1:
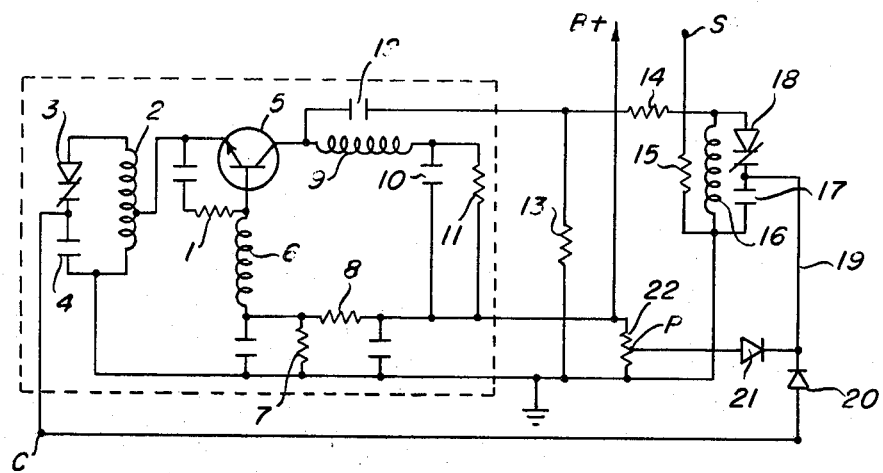
FIG. 1 is the circuit diagram of the apparatus according to the invention.

FIG. 1 illustrates the electric circuit of the oscillator with low harmonic ratio. 5 is the oscillating transistor, 2 - 3 the tuned circuit defining the oscillation frequency, at C the connection to the control voltage source of the varicap 3 setting the operating frequency. The output circuit consists of the ballast resistor 13 in parallel with the attenuator comprising resistors 14 and 15. Connected in parallel with resistor 15 is the second tuned circuit 16 - 18. The load is applied between terminal S and earth and the supply voltage between the earth and terminal B. The non linear control circuit of varicap 18 consists of the two diodes 20 and 21. The emitter of the transistor 5 is coupled to the input tunel circuit at an intermediate point of the inductance 2. The oscillation is established owing to the coupling effected by inductance 6 connected in the base circuit and to the base emitter coupling resistor 1. As will hereinafter be explained, such a circuit has been designed as an hybrid integrated circuit.

The operation of the apparatus according to the invention will be explained in the following with reference to FIGS. 2 and 3.

Figure 2:
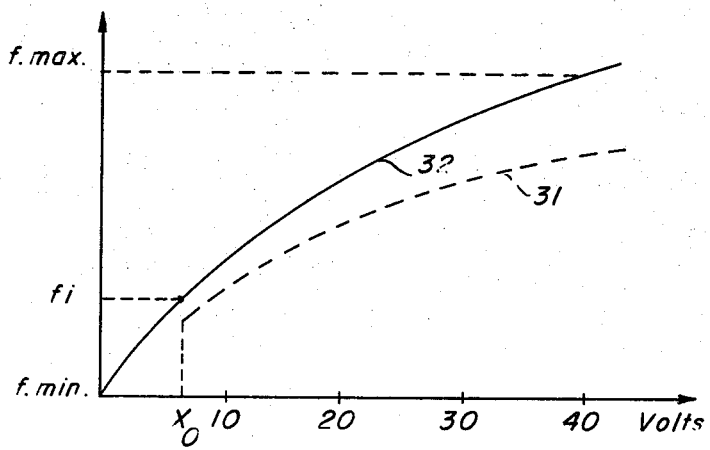
FIG. 2 illustrates the law of variation of the control voltage applied to the two varicaps.
Figure 3:
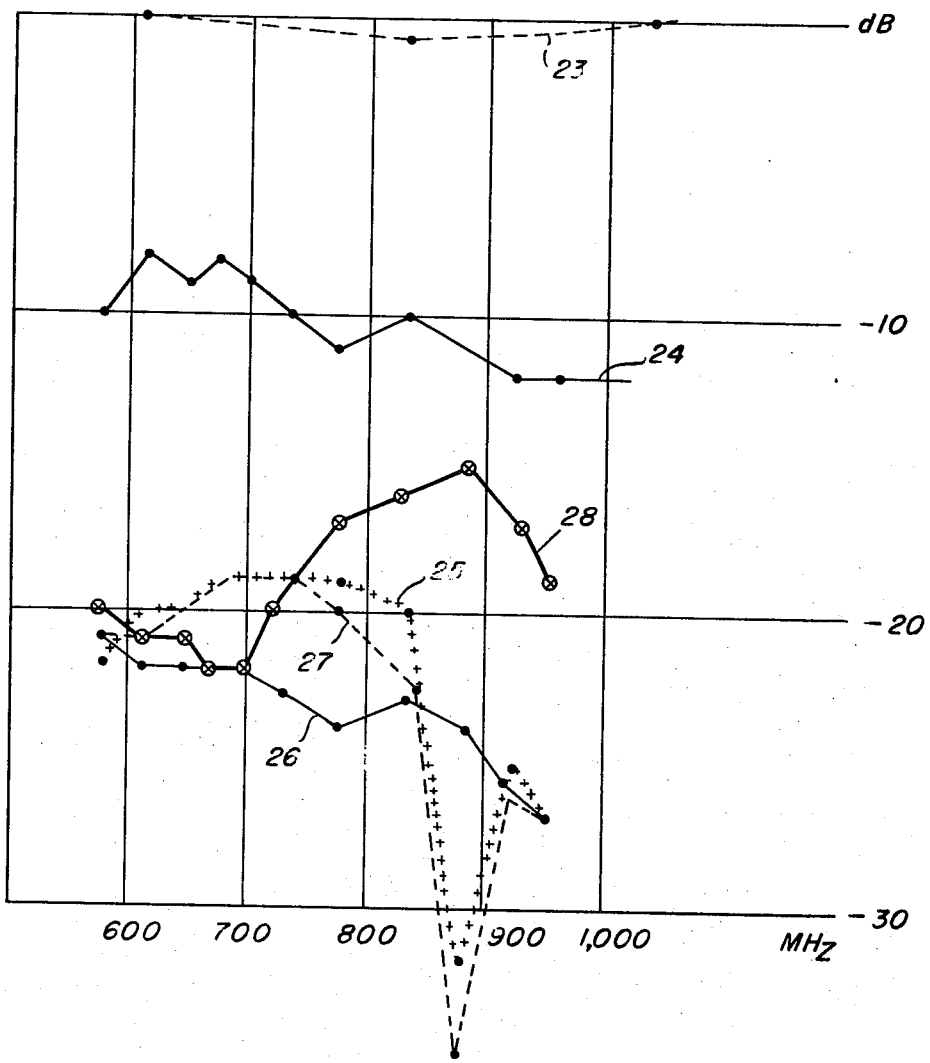
FIG. 3 shows the curve representing the variation of the level of the fundamental frequency wave in the frequency band covered by the oscillator, as well as the curves of the harmonic contents with and without the apparatus according to the invention.

FIG. 2 illustrates the variation of the control voltage applied, respectively, to the varicap 3 of the tuning circuit (curve 32) and to the varicap 18 of the second tuned circuit (chain-lined curve 31) as a function of the oscillation frequency. The curve 32 is characteristic of a varicap and the manufacturer supplies to the user a curve showing the value of the capacitance as a function of the bias voltage. The variation of the resonance frequency of the circuit 2 - 3 can therefore be deduced therefrom which leads to the curve 32. It is often more precise to measure it on the circuit because inductance 2 may vary in the frequency band specially in the case where the hybrid technology is employed.

In accordance with the essential feature of the invention, there is applied to the varicap 18 a control voltage which is different from that applied to varicap 3, at least in a fraction of the frequency range. As is shown by the curve 31, a constant voltage $X_o$ is applied to the diode 18 up to a frequency $f_j$. Beyond this, the diode 18 receives the same control voltage.

In accordance with one feature of the invention, the inductance of the inductor 16 is higher than that of the inductor 2. Moreover, the resonance frequency of the circuit 16 - 18 is lower than that of the circuit 2 - 3 even if the same control voltage is applied to 3 and 18. As is apparent from the diagram, the value $X_o$ is defined by the position of the point P on the voltage divider 22 established between the positive terminal B of the supply and earth, which defines the bias of the diode 21 and the threshold from which the control voltage C is applied to the diode 18. The position of P can be experimentally determined by measuring the harmonic content at each frequency of the range, as illustrated by the curves of FIG. 3. The curve 23 represents the level of the fundamental frequency, curves 24 and 25 show the levels, respectively of the second and the third harmonics as measured across resistor 13.

By way of illustration, an oscillator operating in the frequency band between 600 and 1000 MHz with limited the second and third harmonic ratios has been developped with the following elements: resistors 14 and 15 have the values 20 and 150 ohms respectively; the inductance 16 has a value equal to 15 nanohenrys; the varicap 18 which is marketed by the French Company THOMSON-CSF under the reference EH43 has a capacitance equal to 7.5 pf when the control voltage $V_f$ is equal to 1 volt, and a capacitance equal to 1.2 pf it is equal to 45 volts. The value $X_o$ is equal to 2.5 volts and the frequency $f_i$ corresponding thereto is equal to 625 MHz. The output level of the oscillator at the fundamental frequency is equal to 15 $dB_m$ ± 0.3 dB. The difference between the levels of the second harmonic and of the fundamental is increased from 4 to 12 dB in the operating band when the apparatus according to the invention is connected in parallel with the oscillator and the representative curve 24 is replaced by the curve 28. The level of the third harmonic varies between curves 27 and 26 according to the setting of point P.

The apparatus described in the foregoing was designed using integrated hybrid technology. The resistors 11 and 15 and the voltage divider bridge comprising resistor 22 are made by metallisation of the alumina substrate on which the transistor 5 is mounted. The inductor 16 is a 3 turn metallisation surrounding a square having sides measuring 1.6 millimeters. The substrate comprising the oscillator and the apparatus according to the invention are contained a standardized casing T08 having four pins, of a diameter of 14 millimeters as will be shown in FIG. 7.

The apparatus just described has the advantage of introducing a level difference of at least 15 dB between the fundamental and its second harmonic while permitting a design requiring very low current consumption. Assuming that an increase in consumption can be accepted, a variant has been designed in which the voltage at the mid point between 18 and 16 follows the law of variation represented by the curve 31 and the diodes 21 and 22 are replaced by a second voltage divider bridge comprising resistors between the points P and C; an intermediate point on this second divider bridge is connected to the mid point between 18 and 16 by the lead 19, provided that the respective division ratios of the bridge 22 and of the second divider bridge are appropriately chosen. In this variant, the difference between the levels of the fundamental wave and of the second harmonic is greater than 20 dB and the difference between the levels of the fundamental wave and of the third harmonic is greater than 19 dB in the band. The hybrid technology often gives devices having poor temperature stability owing among others to the temperature coefficient of the active elements. Layer compositions are known which reduce the temperature coefficient of the passive elements of the circuit. This disadvantage is reduced, in accordance with the present invention, by reducing the coupling between the resonating circuit 2 - 3 and the transistor 5, which would have the harmful effect of reducing the frequency band at given power available at terminal S and by compensating for this reduction by a particular design of the second tuned circuit 18 - 16 and by the choice of the operating point of the transistor.

In accordance with the present invention, it is proposed to make the second resonating circuit such that its inductance is higher than that of the first circuit and to maintain its natural resonance frequency, at least in a fraction of the operating frequency band, below the oscillation frequency set by the first circuit, so that the resultant impedance is reactive. This result is obtained by adjusting the value $X_o$ of the control voltage (cf curve in FIG. 3) in such manner that the impedance of the second tuned circuit remains reactive in a third of the operating frequency band.

Experience has shown that it is preferable to use an inductor 16 which has an inductance from two to six times higher than that of 2, while reducing the coupling between the first tuned circuit and the transistor emitter to a value between one half and one third of the inductance 2 in order to obtain the best compromise between temperature stability and bandwidth. The output level is maintained constant in the band by strongly biasing the oscillating transistor.

Figure 4:
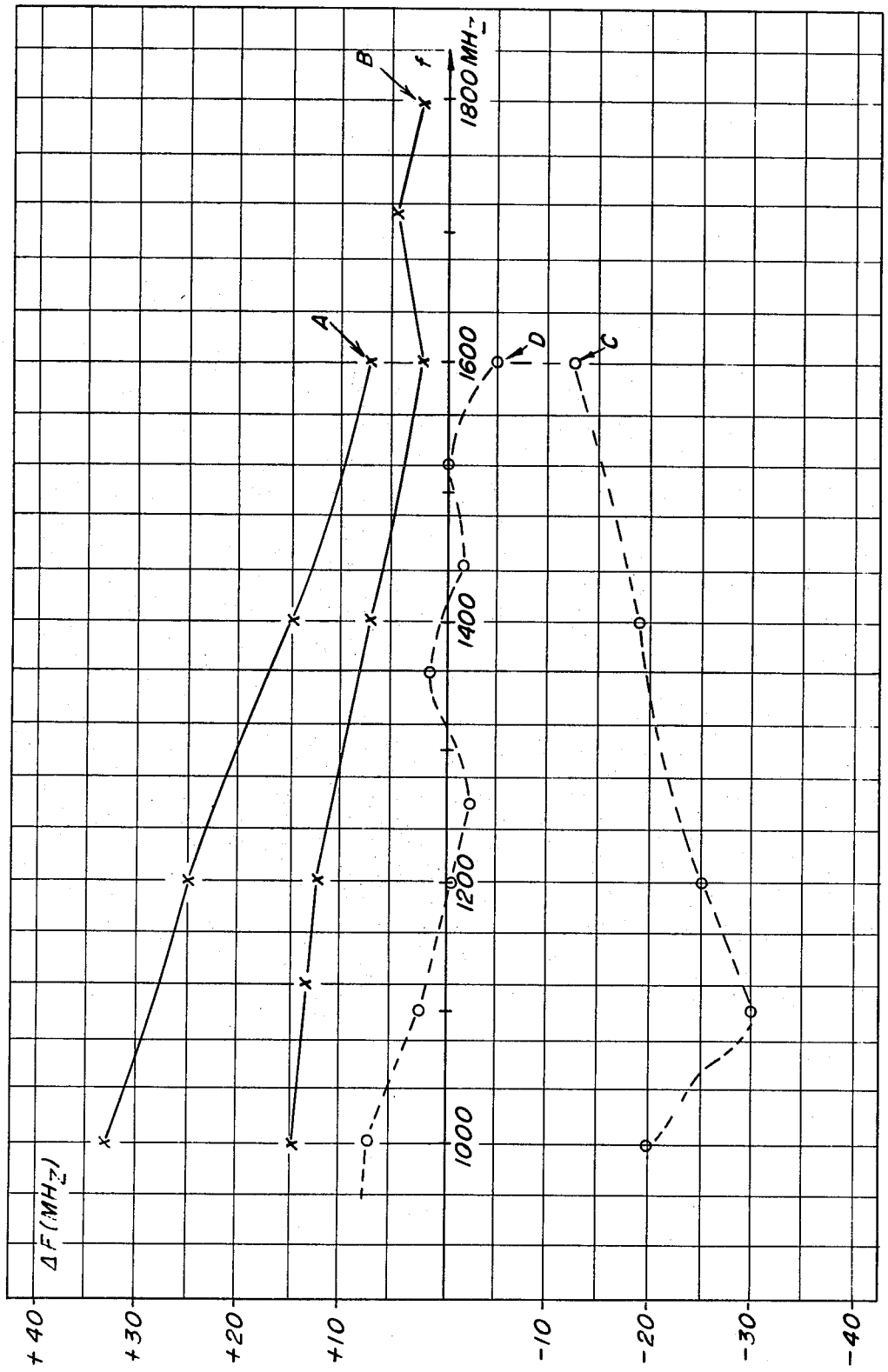
FIG. 4 is a curve illustrating the variation of the temperature coefficient of the oscillation frequency.

FIG. 4 illustrates the variation of the thermal drift coefficient of the oscillator as a function of the coupling between 5 and the circuit 2 - 3. The curves represent the frequency difference ΔF in MHz in relation to the rated frequency F at ambient temperature as a function of the latter under the following conditions:

the curve A is the result of measurements made at −10° C. with maximum coupling (emitter connected to the end of the inductor 2 closer to earth);

the curve B that of measurements made at the same temperature when the emitter is coupled to one third along inductor 2;

the curve C that of measurements made at 70° C. with maximum coupling;

the curve D that of measurements made at 70° C. with the coupling to one third along inductor.

It is very clearly apparent that curves B and D are contained within the space between the curves A and C, throughout the whole frequency range. The thermal drift between −10° C. and 70° C. is therefore reduced by reduction of the coupling between the tuned circuit and the input circuit of the transistor.

Figure 5:
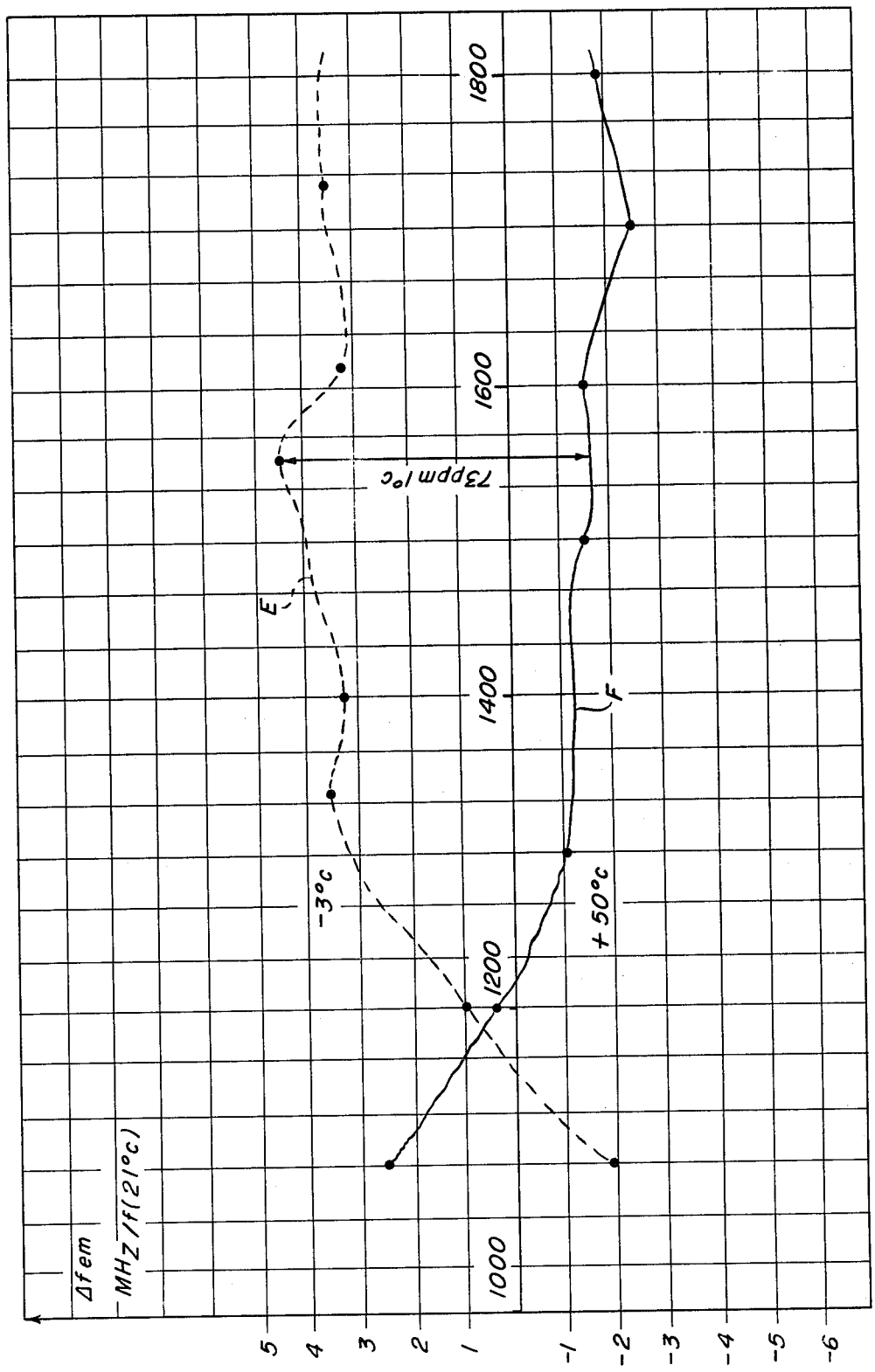
FIGS. 5 and 6 are curves illustrating the frequency and output power differences in the frequency band as a function of temperature.

FIG. 5 shows the thermal drift characteristic of the oscillator after optimization of the coupling between the type X100 transistor as manufactured by the Assignee of the present application and the inductor of the first tuned circuit. As is apparent, FIG. 5 illustrates, in the same frequency range as FIG. 4, the differences of the oscillation frequency from the rated value at −3° C. (curve E) and +50° C. (curve F) respectively. It will be seen that the thermal frequency shift has a maximum value around 1550 MHz of 73 ppm per degree.

It is to be understood that the coupling affects both the bandwidth of the oscillator and its output power.

Figure 6:
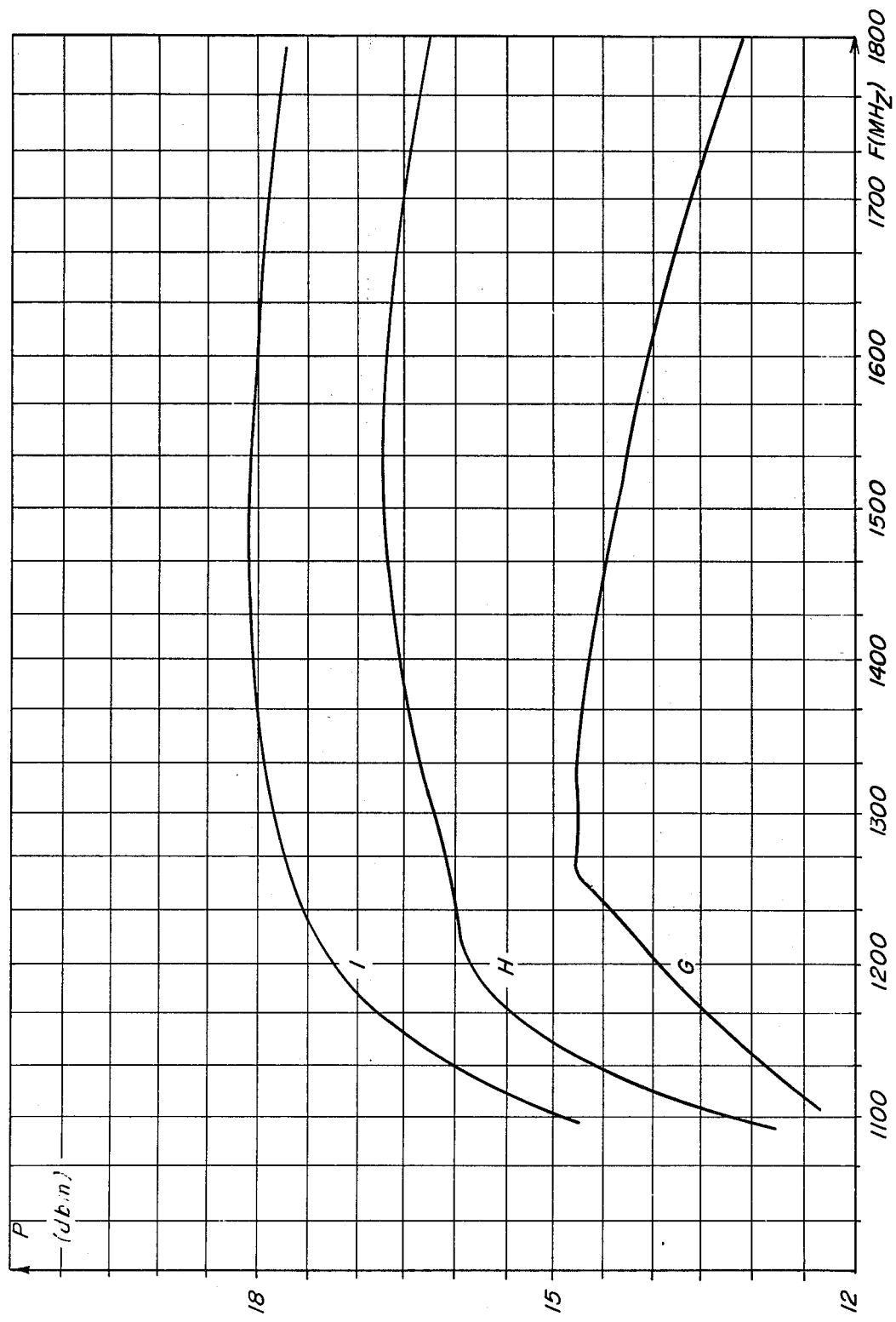

The curves of FIG. 6 represent the variation of the output power, with constant coupling, as a function of the supply voltage of the transistor. As is apparent from curve G, which corresponds to a supply at 15 V 38 mA, the variation of level in the frequency band is about 2 dB.

In accordance with the invention, this variation is reduced by increasing the continuous bias current ($I_c$) of the transistor and it will be seen that under these conditions the variation of level decreases substantially. The supply conditions corresponding to curves G, H and I are respectively:

| Curve G | 15 V | 38 mA |
|---------|------|-------|
| Curve H | 18 V | 46 mA |
| Curve I | 20 V | 54 mA |

It is to be understood that the curves of FIG. 6 correspond to a transistor of type X100 manufactured by the Assignee. However, experience has shown that if other commercially available microwave transistors having cut-off frequencies of several GHz are used, good power stability (variation of less than 1 dB) is obtained in the band by biasing the transistor in such manner that the bias current is higher than 30 mA. The choice of the bias conditions is limited on the one hand by the maximum thermal dissipation of the elements of the circuit and on the other hand by the maximum permitted consumable power in the case of microminiaturized circuits.

The measurements whose results are shown by the aforesaid curves were made at the terminals of the ballast resistor 13. The output circuit 6 - 18 does not affect these results. As has been stated, the use of the attenuator arrangement 14 - 15 and the second tuned circuit has the effect of decoupling the load and makes the oscillator more stable to variations of the latter. The use of this circuit has the effect of reducing the level of the harmonics present in the output signal.

Experience has shown that the best results are obtained by maintaining a difference between the resonance frequencies of the circuits 2 - 3 and 16 - 18 between 50 and 100 MHz in the 800–1800 MHz band of the aforesaid designs when the Q-factors of the circuits are in the neighbourhood of 45. This corresponds to an equivalent inductance of the second tuned circuit of the order of 150 ohms in the lower third of the band, assuming a load having the standard value of 50 ohms.

A design based on the aforesaid results operating in the 500–1000 MHz band gave the following results:

Table 1

| F at 25° C. MHz | P + dBm (power) | −10° C. at + 70° C. | | Harmonics | |
|---|---|---|---|---|---|
| | | ΔF MHz | ΔF dB | 2nd \|dB\| | 3rd \|dB\| |
| 518 | 11 | 13.6 | .5 | 20 | 31 |
| 578 | 13.6 | 8.3 | .2 | 23 | 23 |
| 632 | 14 | 6 | .2 | 19 | 18 |
| 673 | 14 | 6.2 | .1 | 18 | 18 |
| 705 | 14.1 | 6 | .1 | 20 | 22 |
| 732 | 14.2 | 6 | .1 | 24 | 20 |
| 776 | 14.3 | 6.3 | .1 | 26 | 18 |

Table 1-continued

| F at 25° C. MHz | P + dBm (power) | −10° C. at + 70° C. | | Harmonics | |
|---|---|---|---|---|---|
| | | ΔF MHz | ΔF dB | 2nd \|dB\| | 3rd \|dB\| |
| 827 | 14.3 | 6.4 | .1 | 34 | 26 |
| 891 | 13.8 | 6.9 | .2 | 42 | 27 |
| 942 | 13.1 | 7.1 | .2 | 45 | 30 |
| 988 | 12.2 | 7.2 | .1 | 50 | 36 |
| 1029 | 12.7 | 7.8 | .1 | 44 | 36 |

Figure 7:
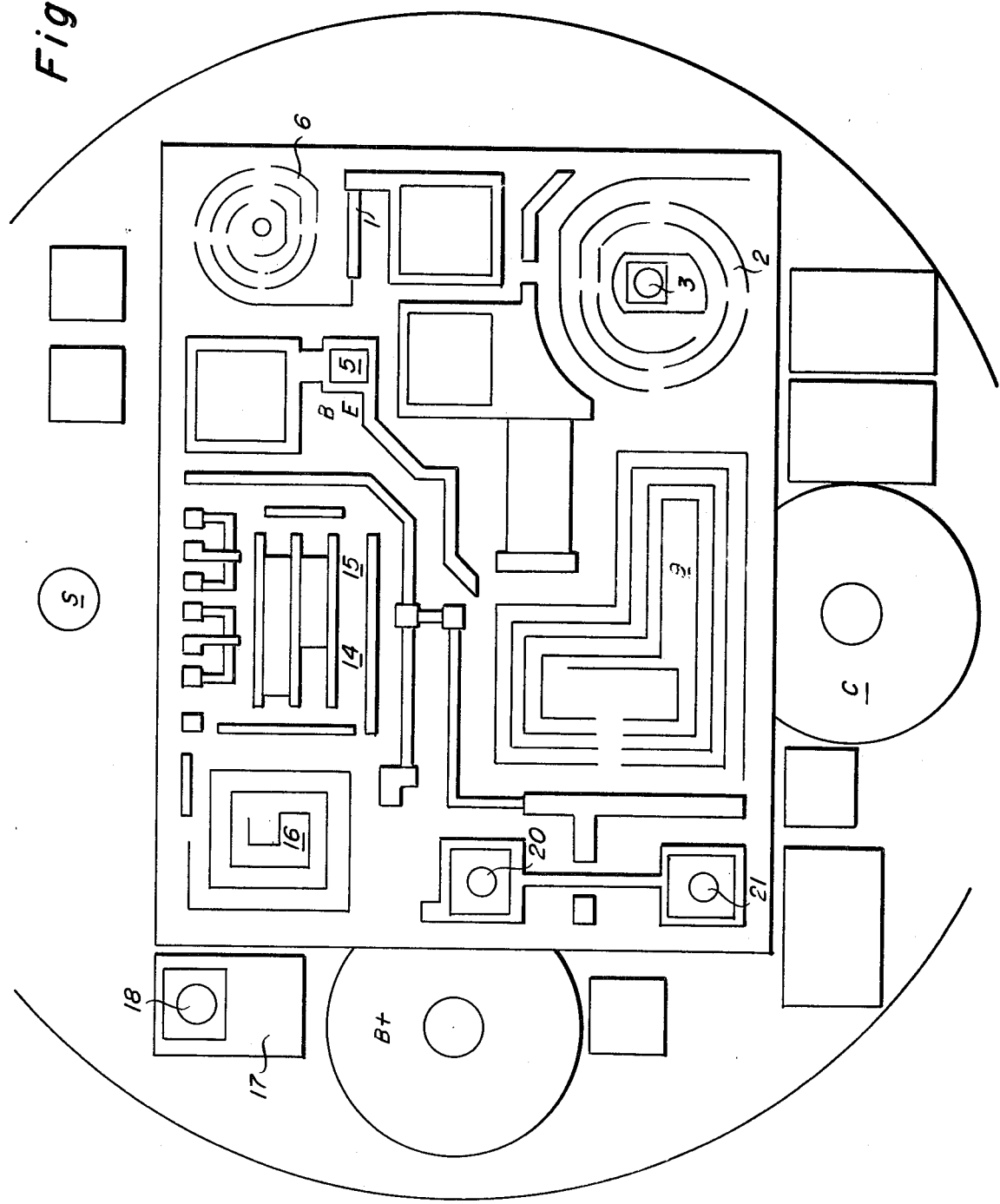
FIG. 7 is a diagram illustrating the lay-out of the circuit of FIG. 1.

FIG. 7 is a drawing illustrating a particular embodiment of the invention in the form of a hybrid integrated circuit showing the printed circuit and the active parts. The various elements of the figure are shown with the references of the corresponding elements in the diagram of FIG. 1. Without entering into the details of the technological manufacture of the various elements of the circuit, it will be observed that the varicap 3 has been placed at the center of the spiral constituting the associated inductance 2. This arrangement is particularly favourable in that it shortens the connections between the adjustable capacitive element and the associated inductor whereby the parasitic inductance introduced by the said connections is reduced. Likewise, the relative positions of the various circuit elements have been carefully chosen so as to minimize the stray impedances of the interconnecting wires.

What we claim:

1. UHF voltage controlled oscillator comprising:
   a first frequency setting tuned circuit made of a first varicap and a fixed inductor;
   a microwave transistor having a cut-off frequency of several GHz, of which the emitter is coupled to said inductor of said tuned circuit and of which the collector is connected to the load by way of an output circuit, characterized in that the said output circuit consists of an output resistor connected in parallel with an attenuator comprising resistors, one of which resistors is shunted by a second tuned circuit connected between load and earth made of a second varicap and a second inductor, means being provided to maintain the said varicap biased;
   means for applying a control voltage to said first varicap; and
   means incorporating a non linear circuit for applying said control voltage to the second varicap.

2. UHF oscillator according to claim 1, wherein the inductor of the second tuned circuit has an inductance two to five times as large as that of the first tuned circuit.

3. UHF oscillator according to claim 1, wherein the emitter of the transistor is coupled to one third of the inductor of the first tuned circuit.

4. UHF oscillator according to claim 1, wherein the transistor is so biased that the current in the collector exceeds 30 mA.

5. UHF oscillator according to claim 1, wherein the resonance frequency of the second circuit is lower than that of the first circuit in at least one third of the frequency range.

6. UHF oscillator according to claim 1, wherein the second varicap is connected to the control voltage source of the first varicap through a network of two appropriately biased diodes.

* * * * *